(12) United States Patent
Kiwitt et al.

(10) Patent No.: US 7,859,363 B2
(45) Date of Patent: Dec. 28, 2010

(54) COMPONENT COMPRISING AT LEAST ONE FILTER THAT OPERATES WITH ACOUSTIC WAVES

(75) Inventors: Juergen Kiwitt, Munich (DE); Maximilian Pitschi, Rottach-Egern (DE)

(73) Assignee: EPCOS AG, Munich (DE)

( * ) Notice: Subject to any disclaimer, the term of this patent is extended or adjusted under 35 U.S.C. 154(b) by 157 days.

(21) Appl. No.: 12/067,728

(22) PCT Filed: Sep. 19, 2006

(86) PCT No.: PCT/DE2006/001649
§ 371 (c)(1), (2), (4) Date: Mar. 21, 2008

(87) PCT Pub. No.: WO2007/033652
PCT Pub. Date: Mar. 29, 2007

(65) Prior Publication Data
US 2008/0246557 A1    Oct. 9, 2008

(30) Foreign Application Priority Data
Sep. 22, 2005  (DE)  ........................ 10 2005 045 372

(51) Int. Cl.
*H03H 9/72* (2006.01)
*H03H 9/64* (2006.01)

(52) U.S. Cl. ...................... 333/133; 333/193; 333/195
(58) Field of Classification Search .................. 333/133, 333/193, 195
See application file for complete search history.

(56) References Cited
U.S. PATENT DOCUMENTS

| | | | |
|---|---|---|---|
| 5,998,907 A * | 12/1999 | Taguchi et al. .......... 310/313 R |
| 6,424,238 B1 * | 7/2002 | Penunuri .................... 333/187 |
| 6,759,924 B2 * | 7/2004 | Sakuragawa et al. ........ 333/133 |
| 7,102,460 B2 * | 9/2006 | Schmidhammer et al. ... 333/133 |
| 7,213,314 B2 * | 5/2007 | Abbott et al. .............. 29/25.35 |
| 7,459,991 B2 * | 12/2008 | Ruile et al. ................. 333/133 |
| 2003/0001696 A1 * | 1/2003 | Yoshida et al. ............. 333/193 |
| 2004/0061572 A1 * | 4/2004 | Nakamura .................. 333/133 |

(Continued)

FOREIGN PATENT DOCUMENTS

DE    103 52 642    6/2005

(Continued)

OTHER PUBLICATIONS

Miura M. et al "Temperature Compensated LiTaO3/Sapphire Bonded SAW Substrate with Low Loss and High Coupling factor Suitable for US-PCS Application" IEEE Ultrasonics Symposium 2004, Montreal Canada Aug. 23-27, 2004. pp. 1322-1325. XP 010784202, ISBN 0-7803-8412-1.

(Continued)

*Primary Examiner*—Benny Lee
*Assistant Examiner*—Alan Wong
(74) *Attorney, Agent, or Firm*—Fish & Richardson P.C.

(57) ABSTRACT

A component includes a first filter configured to work with acoustic waves. The first filter includes a first sub-filter on a first chip and a second sub-filter on a second chip separate from the first chip. The first filter if a different type of filter, has a different layer structure, or has a different layer thicknesses for at least one layer in comparison to the second filter.

18 Claims, 5 Drawing Sheets

U.S. PATENT DOCUMENTS

2004/0070313 A1* 4/2004 Furukawa et al. ....... 310/313 R
2006/0028298 A1* 2/2006 Nakamura et al. .......... 333/133
2007/0191055 A1 8/2007 Kovacs et al.

FOREIGN PATENT DOCUMENTS

EP 1365509 5/2007
WO WO 2004066493 A1 * 8/2004

OTHER PUBLICATIONS

International Search Report for PCT/DE2006/001649, Jan. 15, 2007.
Written Opinion for PCT/DE2006/001649, Jan. 15, 2007.
English translation of Written Opinion for PCT/DE2006/0016749, Jan. 15, 2007.

* cited by examiner

COMPONENT COMPRISING AT LEAST ONE FILTER THAT OPERATES WITH ACOUSTIC WAVES

CROSS REFERENCE TO RELATED APPLICATIONS

Pursuant to 35 USC §120, this application claims the benefit of PCT/DE2006/001649 filed Sep. 19, 2006 which claims the benefit of German Patent Application No. 102005045372.4 filed Sep. 22, 2005. Each of these applications is incorporated by reference in its entirety.

SUMMARY

The invention relates to a component with at least one filter that works with acoustic waves, as used particularly in terminal devices of mobile communication systems. The receiving paths of mobile terminal devices are usually designed asymmetrically/symmetrically, where the asymmetric side is connected in the advantageously asymmetric terminal of the antenna. The symmetric output on the IC side has the advantage that with symmetrical (balanced) signals, technical advantages, for example, greater crosstalk robustness and better adaptation to IC processes, can be realized. The conversion of a symmetric signal at the input of a receiving path into a symmetric signal at the output of the receiving path can be carried out, for example, with a BALUN, which, however, presents the disadvantage that, as a discrete component, it requires additional board space. Therefore, it is advantageous to use a filter in which the BALUN function is integrated. For this purpose, DMS filters (dual mode SAW filters) are available.

One problem which occurs in components with filters in mobile terminal devices is the temperature sensitivity of frequency, i.e., the instability of the frequency of the component when the temperature is increased. This frequency sensitivity can be up to 40 ppm/K, depending on the substrate or interface used, for example, with lithium tantalate, which is intolerably high for frequency-sensitive use, for example, in duplexers in PCS systems. Other substrates or interfaces present a higher temperature sensitivity of frequency.

For reactance filters, which are constructed from resonator structures, possibilities are already known to reduce the temperature sensitivity of the frequency. However, these processes typically cannot be easily transferred to DMS filters.

Another problem is that, in components which contain two or more filters, for example, in duplexers, sufficiently high isolation must be ensured between the different filters.

The problem of the present invention is therefore to provide a component which is improved with regard to at least one of the two mentioned problem areas.

According to the invention, the problem is solved with a component having the characteristics of claim 1. Advantageous embodiments can be obtained from the additional claims.

It is proposed to divide a filter that works with acoustic waves into a first sub-filter and a second sub-filter, which are preferably connected in series and perform different sub-tasks or -functions of the overall filter. The two sub-filters differ in that they are assigned either to different filter types and based on different filter technologies, or they present a layer structure with different materials or number of layers, or a different layer thickness with regard to at least one layer. Both sub-filters are arranged on separate chips.

In this way, it is possible to optimize each sub-filter separately from the other, and optionally to use a different substrate material, in each case a special metallization material or a different metallization level, or to carry out additional optimizations in each case for only one sub-filter, without having to take into consideration the other sub-filter in the process.

Thus, it is possible, for example, to provide one of the two sub-filters with measures for temperature compensation. Specifically, this refers to a sub-filter that is formed from a reactance filter constructed from resonators. Resonators are simply constructed components that work with acoustic waves, and whose physical and acoustic behavior can be modeled, and consequently varied, in a simple way.

A first sub-filter, which is constructed from one-port SAW resonators, can be provided, for example, with a compensation layer, which reduces the temperature sensitivity of the center frequency, and thus provides temperature compensation for the filter. Such a compensation layer consists, for example, of a silicon oxide layer, which is applied in a layer thickness of 5 to 40% of the acoustic wavelength on the piezoelectric substrate above or beneath the metallization. This $SiO_2$ layer possesses a lower temperature sensitivity of frequency than the piezoelectric material. Because the acoustic surface wave propagates at least in part inside the silicon oxide layer, the temperature sensitivity of the overall filter is thus also reduced. The $SiO_2$ layer is made preferably exclusively by an amorphous modification with no overall order, and it has a high layer homogeneity.

The temperature compensated first sub-filter can also be constructed from resonators that work with bulk acoustic waves, so-called BAW resonators.

A filter that is assembled of two sub-filters, one of which is temperature-compensated, also presents a reduced temperature sensitivity of the frequency in the performance of the overall filter. If the first sub-filter is a reactance filter, then the second sub-filter is preferably a DMS filter whose properties advantageously complement the properties of the reactance filter to form an improved overall filter. While in a reactance filter, the individual pole locations can be shifted, and thus the edge steepness and the adjacent channel suppression can be improved, the DMS filter is characterized by a good remote selection. The filter here combines the advantages of the two sub-filters.

In a variant, a second filter is provided, which is arranged together with the first sub-filter on a common chip. This second filter uses preferably the same filter technology as the first sub-filter and can then be optimized advantageously together with it.

However, it is also possible for the second filter to comprise two sub-filters, which work with different filter technologies, where the sub-filters of the same filter type but belonging to different filters are arranged on a common chip. In this way, the sub-filters of two filters can be distributed over two chips and optimized separately from each other.

The first filter and the second filter can be connected to form a module, and form, for example, a duplexer, where the two filters respectively function as an input and an output filter for different frequency bands, which are provided within a mobile communications standard for transmission and reception, respectively. Because the transmitting and receiving bands, and thus the corresponding filters, are usually close to each other in terms of frequency, it is also possible to jointly optimize sub-filters that are combined on a common chip, because frequency-dependent optimizations, for example, with respect to the metallization level, can thus be applied to both sub-filters without serious disadvantages.

It is also possible to provide a third filter or additional filters which are realized together with the first or second sub-filter and the second filter or a sub-filter thereof on a common chip.

In this way, the filter functions of three or more filters can be distributed over two chips. The third and optionally additional filter can here be used for other mobile communications transmission systems.

The two sub-filters as well as optionally the second, third and additional filter are preferably arranged on a common substrate (SU), which presents at least one metallization plane (e.g., metallization planes MP1 and MP2), in which a connection is realized. By this common substrate (SU), the connection of the sub-filters and optionally the filters is carried out. The substrate is a multilayered laminate, or preferably a multilayered ceramic, where, on and between dielectric ceramic layers (DL), metallization planes (e.g., metallization planes MP1 and MP2) are provided. The common substrate can also represent a module substrate on which additional components are arranged.

The components can be chosen from filters, active semiconductor components, and passive components. However, it is also possible to integrate at least some of the passive components into the substrate, by realizing the them in a metallization plane by appropriately designed metallization structures, and connecting them to the filter. Passive components can be used particularly to adapt the filter(s) to the external circuit environment and/or to improve the isolation of the different filters connected to each other.

A chip on which sub-filters of at least one filter are realized can be temperature-compensated by means of a strain layer. The latter layer is mechanically securely connected to the surface of the chip, which is opposite to the surface with the component structures. The material of the strain layer has a thermal expansion coefficient which is less than that of the chip material. The result of the mechanically secure connection is that the thermal expansion of the overall chip is the average of the thermal properties of two different materials. If layer thickness of the chip is less than that of the strain layer, then the properties of the strain layer have a greater influence on the properties of the overall chip. The strain layer can be used both for reactance filters and for DMS filters.

A temperature-compensated filter or sub-filter can also be realized with component structures which comprise a material or material combination, which, overall, has a higher density than pure aluminum. Even with heavy component structures it is possible to achieve a frequency response that has a lower temperature sensitivity.

At least with temperature-compensated sub-filters or filters it is possible to construct component structures in the form of strip-shaped electrode fingers, whose lateral edges are at an angle with respect to the substrate surface, and form a contact angle therewith of 65-85°. As a result, particularly in connection with a compensation layer, the filter properties can be improved, particularly reflection, and thus the quality of the corresponding resonators.

The invention will be explained below in reference to embodiment examples and the associated figures. The latter are in part schematic and not true to scale, so that neither absolute nor relative dimensional indications are suggested by the figures.

DETAILED DESCRIPTION

Figure 1:
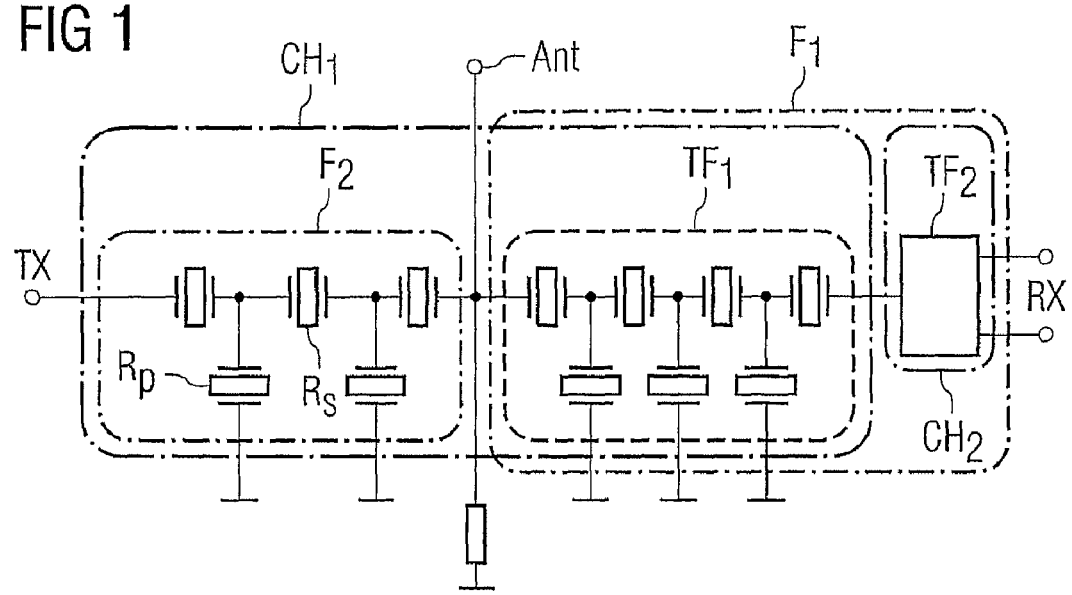
FIG. 1 shows an arrangement with a first filter and a second filter, where the first filter is divided into two sub-filters.

FIG. 1 shows a schematic representation of an arrangement of a first and second filter F1, F2. The first filter F1 consists of two sub-filters TF1, TF2, which are arranged on two different chips CH1 and CH2. The first sub-filter TF1 is a reactance filter, which is constructed from resonators, which are arranged here, for example, in a ladder type configuration. The resonators are designed, for example, as one-port resonators on a piezoelectric substrate.

The second sub-filter TF2 is connected in series with the first sub-filter TF1 and designed, for example, as a DMS filter, which is arranged on a second piezoelectric chip CH2. A second filter F2 is also designed as a reactance filter made up of series resonators $R_S$ and parallel resonators $R_P$ in the ladder type arrangement, and integrated together with the first sub-filter TF1 on the first chip CH1. The entire arrangement is designed here as a duplexer, and in this arrangement all the filter and sub-filters are interconnected. Thus, for example, the output of the second filter F2 is connected to the antenna ANT, as is the input of the first filter F1. The first filter is, for example, an RX filter, while the second filter is the TX filter of the duplexer.

The second sub-filter TF2 which is represented only schematically, and which is designed as a DMS filter, comprises at least two interdigital transducers, which are alternately connected with the input or the output of the sub-filter. However, it is also possible to design the DMS filter from more than three interdigital transducers, which can be arranged, alternately connected with an output, next to each other in an acoustic track. It is also possible, on the other hand, to assemble the DMS filter from two parallel-connected DMS sub-tracks, where each filter is constructed as its own DMS filter. As represented, the DMS filter is designed as an asymmetrically/symmetrically operating filter, which converts an asymmetric signal at the sub-filter input into a symmetric signal at the sub-filter output (RX). An external BALUN is therefore not required.

The reactance filters are assembled from any number of resonators, where at least one basic element is provided, which consists of a series resonator $R_S$, and, connected parallel to the latter, parallel resonators $R_P$ which are connected to ground. Resonators of the same type that are immediately consecutive to each other in the connection can be combined into one single resonator. Therefore, the represented first sub-filter TF1 consists of five basic elements, and the second filter F2 consists here, for example, of four basic elements.

Figure 2:
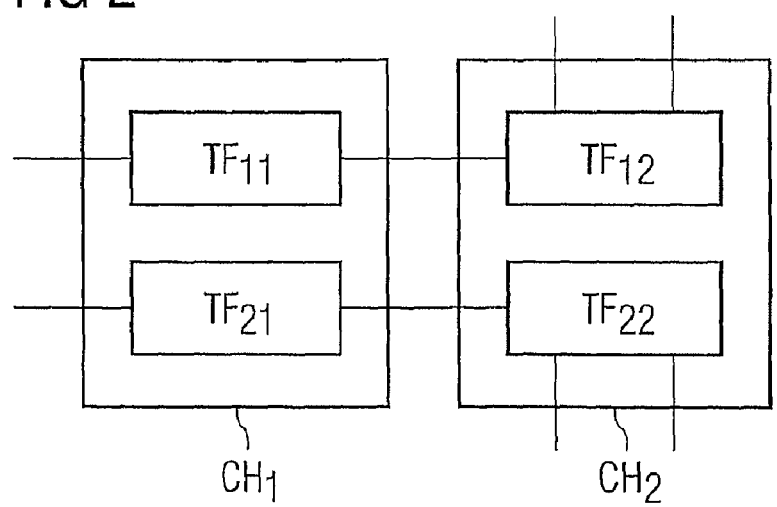
FIG. 2 shows an arrangement in which two filters, each divided into two sub-filters, are integrated on two chips.

FIG. 2 shows an additional embodiment, in which two filters, which each consist of two sub-filters of different filter type or different layer structures, are distributed over two chips CH1, CH2 in such a way that at least two sub-filters of the same type or same structure are integrated on a common chip CH. Each filter can be assembled, as the first filter F1 in FIG. 1, from a first sub-filter of the reactance type and a second sub-filter of the DMS type, so that for both filters asymmetrical/symmetrical operation is possible. The two filters can be connected to each other and also represent, as a component, a duplexer, diplexer, or, in general, a multiplexer. The two filters can, however, also belong to different mobile communications bands and not be directly connected to each other.

Figure 3:
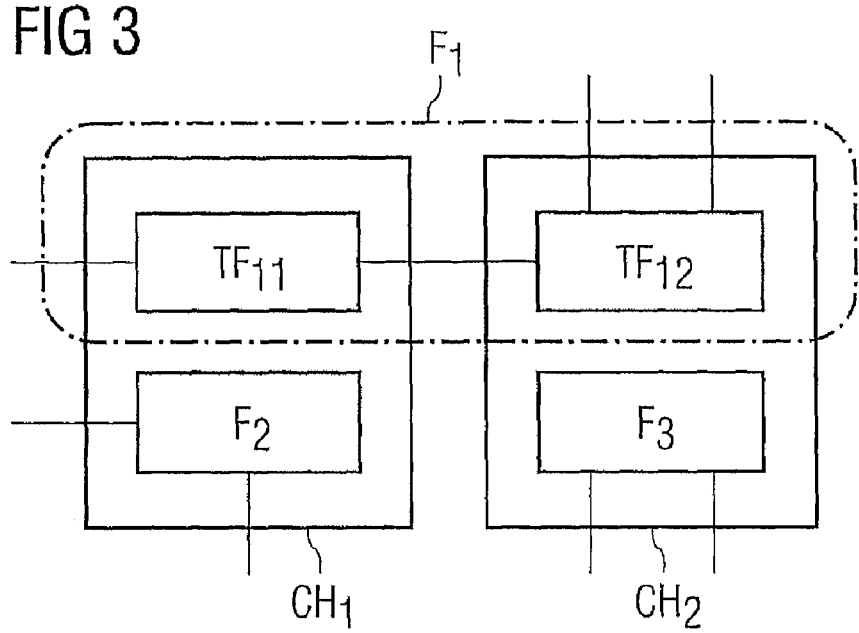
FIG. 3 shows an arrangement in which three filters are integrated on two chips, where the first filter is divided into two sub-filters.

FIG. 3 shows an additional embodiment, in which the arrangement represented in FIG. 1 is expanded by a third filter. On a first chip CH1, a first sub-filter $TF_{11}$ of the first filter, as well as the second filter F2 is integrated. On the second chip CH2, the second sub-filter $TF_{12}$ of the first filter F1, as well as a third filter F3, is integrated. The integration is carried out in such a way that filters or sub-filters of the same filter type or with the same layer structure are realized on a common substrate or chip.

Figure 4:
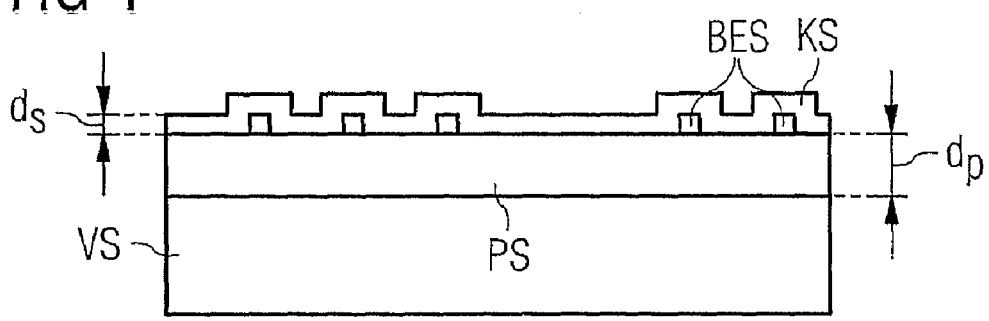
FIG. 4 shows sections of a schematic cross section of a chip with compensation layer and strain layer.

FIG. 4 shows a possibility of compensating at least one of the two sub-filters with respect to the temperature sensitivity of frequency. The temperature compensation is here achieved by means of a compensation layer KS, which is provided above the component structures BES in the form of a silicon oxide layer. As an additional measure, the piezoelectric substrate PS can be mechanically securely connected to a strain layer VS, on the side opposite to the component structures BES, resulting in a composite substrate.

The thickness $d_S$ of the compensation layer KS is optimized, as a tradeoff between maximum temperature compensation and a relatively high layer thickness and minimum damping in the case of minimal layer thickness $d_S$ of the compensation layer KS. Complete compensation can be achieved, for example, with a thickness $d_S$ of 30-40% of the acoustic wavelength (at the center frequency of the filter). The effect of the strain layer VS is increased because the thickness of the piezoelectric layer PS is relatively small compared to the total thickness of the composite substrate made of the strain layer VS and the piezoelectric layer PS. This can be achieved if, after fabrication of the composite substrate, the piezoelectric layer is thinned to a thickness $d_P$ of approximately five to 50 acoustic wavelengths with respect to the center frequency of the filter.

FIG. 4 shows another aspect which, in the case of the use of a compensation layer KS, is advantageous for the properties of the filter. The compensation layer KS is preferably applied so that it conforms to the surface and presents a topology which corresponds to the component structures. In this way, it is ensured that an acoustic surface wave that propagates partially in the compensation layer KS is reflected sufficiently at the structural edges of the compensation layer so that the resonator is of sufficiently high quality.

Figure 5:
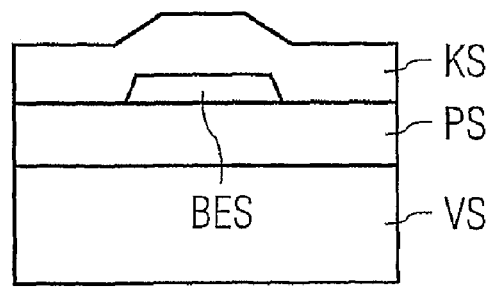
FIG. 5 shows sections in schematic a cross section of a component structure with chamfered edges as well as with a compensation layer and a strain layer.

FIG. 5 shows a possibility of supporting a surface-conformed compensation layer KS. For this purpose, the component structures BES are designed in such a way that they present lateral edges that drop off at an angle. With such slanted side edges, a surface-conformed $SiO_2$ layer can be applied particularly easily. In addition, as represented here, a strain layer VS can also again be provided beneath the piezoelectric layer.

Figure 6:
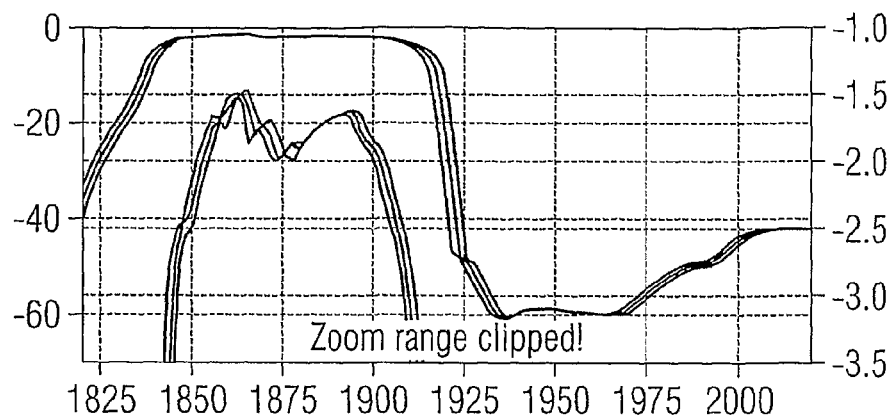
FIGS. 6-8 show the scattering parameter $S_{12}$ for the first filter from FIG. 1, and FIGS. 9-11 show the scattering parameter $S_{12}$ for the second filter.
Figure 7:
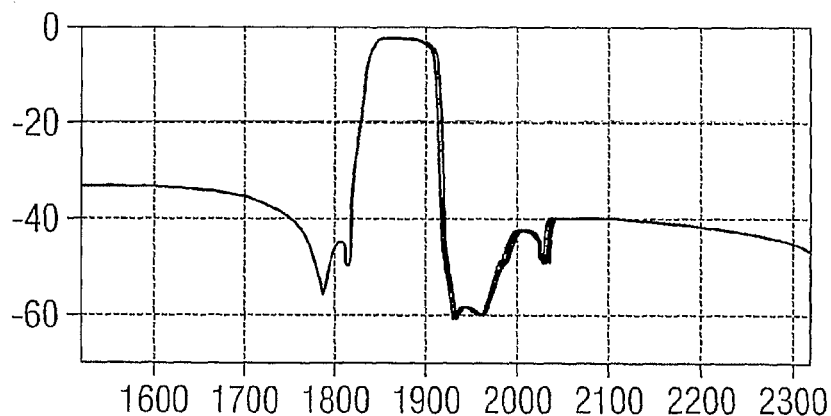
Figure 8:
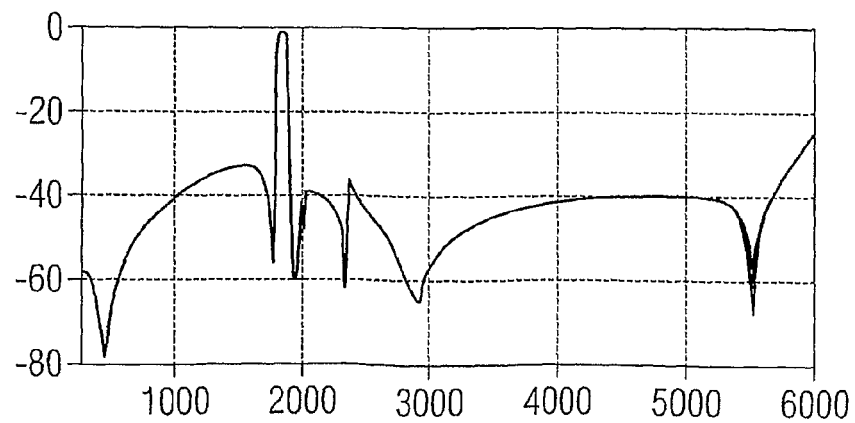

FIGS. 6-8 show the transmission behavior of a second filter F2, which is constructed according to FIG. 1 using the scattering parameter $S_{12}$. A group of curves is represented, where a first curve presents a filter without temperature compensation at a first temperature $T_0$. A second curve shows this uncompensated filter after a temperature increase of 40 K. Here the curves are shifted to lower frequencies. A third curve reflects the behavior of a filter F2 of the same construction, which, however, in contrast to the first and second curve, is provided with temperature compensation. Here the transmission curve is shifted toward low frequencies by a smaller amount than the second curve. It is apparent from the figure that the temperature coefficient was approximately halved by the temperature compensation.

Figure 9:
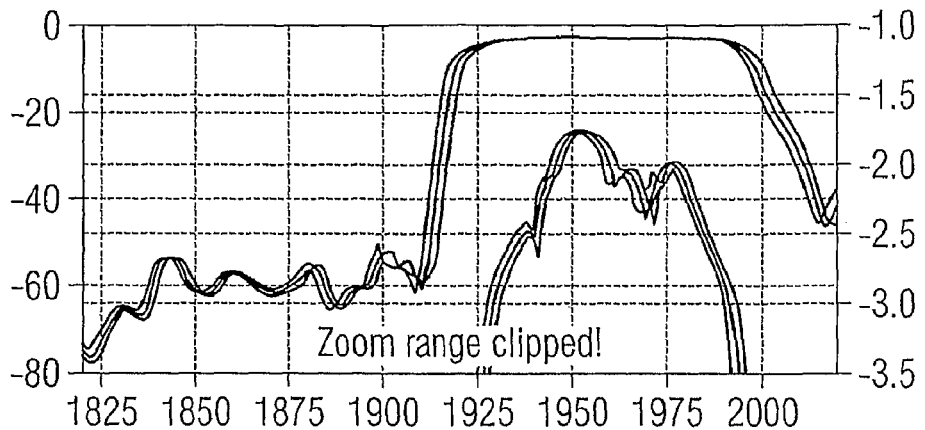
Figure 10:
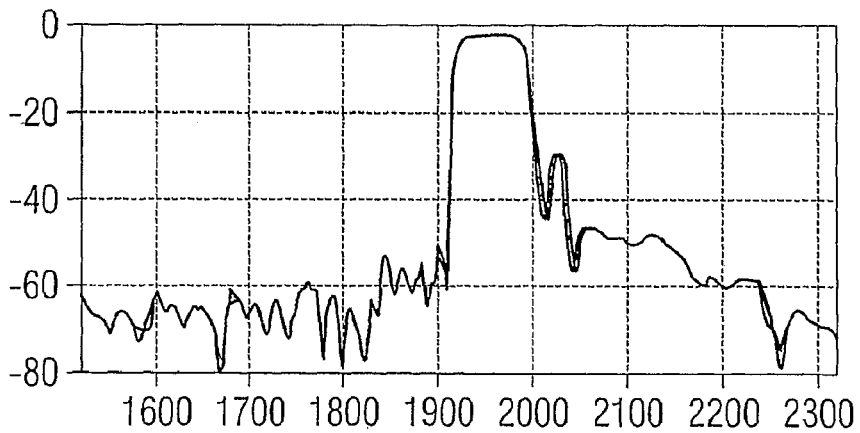
Figure 11:
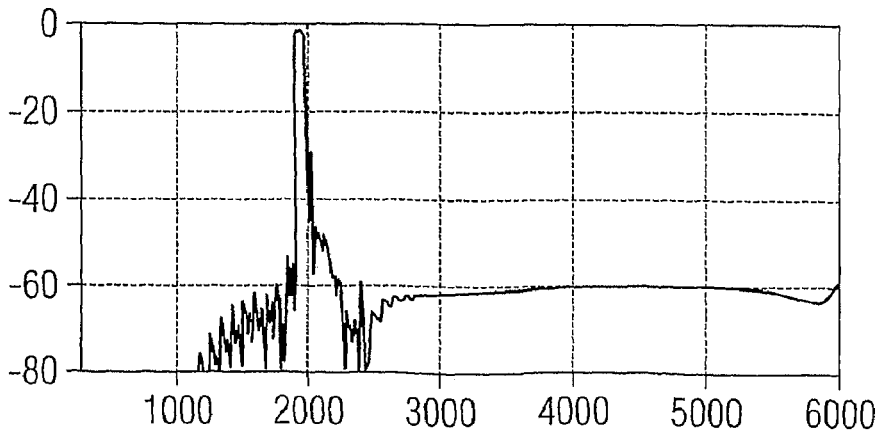

FIGS. 9-11 show the transmission curves of the first filter F1, which is constructed according to FIG. 1, using the scattering parameter $S_{12}$ with different intervals on the frequency axis. Here, too, an uncompensated filter on a chip CH1 is compared with a temperature-compensated filter. Again, a reduction of the temperature coefficient of the frequency can be achieved; however, it is not as pronounced as with the second filter, represented in FIGS. 6-8. The reason for this is that, with the first filter, only one sub-filter is temperature-compensated, so that the effect of the temperature compensation is also not be as pronounced.

With the distribution of sub-filters on different chips, one cannot only achieve independent optimization, but also improved isolation between sub-filters and filters. In duplexers, which are constructed, for example, according to one of the embodiments of FIGS. 1-3, the distribution on different chips results in improved isolation between the RX and the TX filter, so that electromagnetic coupling between the TX output and the RX input is minimized. This results in less crosstalk, and thus improved transmission quality.

Figure 12:
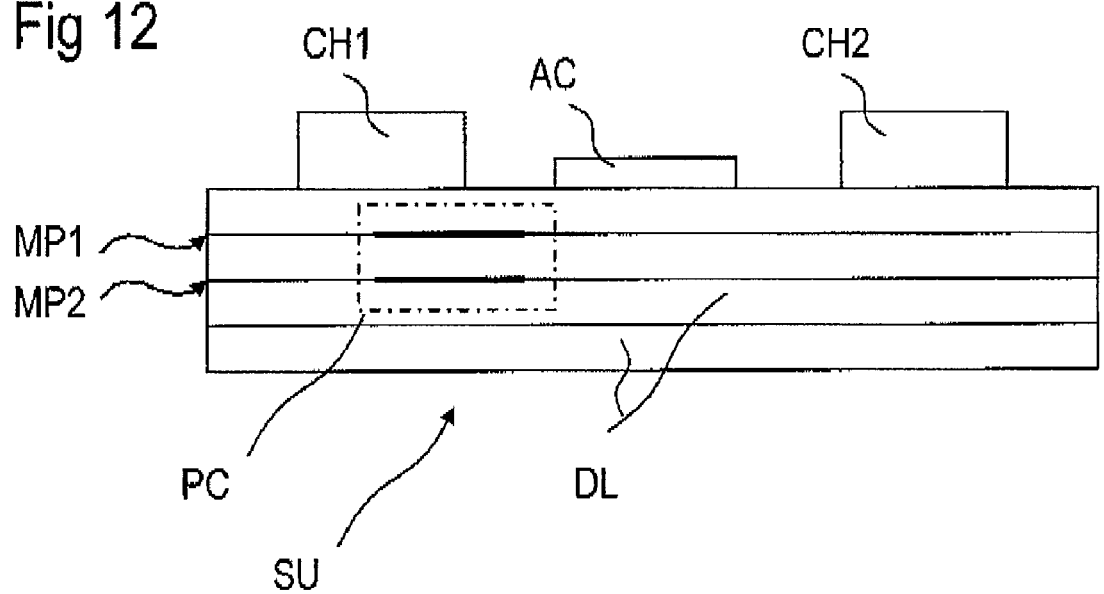
FIG. 12 shows an arrangement in which two chips are arranged on a substrate.

FIG. 12 shows an arrangement in which two chips are arranged on a substrate. Far example, it is proposed to divide a filter that works with acoustic waves into a first sub-filter and a second sub-filter, which are preferably connected in series and perform different sub-tasks or -functions of the overall filter, The two sub-filters differ in that they are assigned either to different filter types and based on different filter technologies, or they present a layer structure with different materials or number of layers, or a different layer thickness with regard to at least one layer. Both sub-filters are arranged on separate chips. As shown in FIG. 12, MP1 is a first metallization plane, MP2 is a second metallization plane, PC is a passive component, SU is a multi-layer ceramic substrate, DL are dielectric layers, and AC is an additional component.

The invention is not limited to the represented embodiment examples and can also be realized, for example, with filters that are assigned to other filter types. It is always essential that the sub-filters distributed on different chips can be optimized independently of each other, so that certain measures may be used with one filter type but not another. With components comprising several filters, it is always essential that the components not be distributed on the basis of individual filters; rather, the parts of at least one filter should be distributed over several chips. As a result, the filters can be processed differently, in a way that is optimal for the given sub-filter, and, during processing, different sub-filters and thus also, for example, sub-filters with different layer structure or different layer thicknesses, can be obtained.

The invention claimed is:

1. A component comprising:
   a first filter configured to work with acoustic waves, the first filter comprising: a first sub-filter on a first chip; and
   a second sub-filter on a second chip separate from the first chip, the first sub-filter being a different type of filter, having a different layer structure, or having a different layer thicknesses for at least one layer than the second sub-filter;
   wherein a first one of one of the first and second sub-filters comprises one or more SAW resonators and is temperature compensated by a compensation layer applied to the associated first one of the first or second chips, the compensation layer being configured such that an acoustic surface wave propagates at least partially in the compensation layer and the compensation layer has lower temperature sensitivity of frequency than the material forming the first or second chip;

wherein a second one of the first and second chips is not temperature compensated and does not include a temperature compensation layer; and wherein the first sub-filter comprises one-port SAW resonators.

2. The component of claim 1, wherein the temperature-compensated sub-filter comprises a SAW filter having interdigital component structures and the compensation layer is applied to the interdigital component structures.

3. The component of claim 2, further comprising a strain layer, wherein the chip that includes the temperature compensated sub-filter is mechanically connected to the strain layer on a surface opposite the interdigital component structures and the strain layer has a lower thermal expansion coefficient than the chip material.

4. The component of claim 2, wherein the interdigital component structures of at least the temperature-compensated sub-filter comprises a material, or a material combination, having a density higher than a density of pure Al.

5. The component of claim 2, wherein the interdigital component structures of at least the temperature-compensated sub-filter comprise strip-shaped electrode fingers having lateral edges at an angle with respect to a substrate surface and forming a contact angle of between about 65° and about 85° with the substrate surface.

6. The component of claim 1, wherein the second sub-filter comprises a DMS filter.

7. The component of claim 1, further comprising a second filter on the first chip with the first sub-filter.

8. The component of claim 7, wherein the first filter and the second filter are connected to form a duplexer.

9. The component of claim 1, further comprising a second filter comprising a first and a second sub-filter, at least one of the first and second sub-filters of each of the first and the second filter being on a common chip.

10. The component of claim 9, wherein at least two of the first sub-filter of the first filter, the second sub-filter of the first filter, the first sub-filter of the second filter, the second sub-filter of the second filter are on the common chip and comprise the same filter type.

11. The component of claim 1, further comprising a third filter on the same chip with the first sub-filter or the second sub-filter.

12. The component of claim 1, wherein:

said first and second sub-filters are on a substrate, the substrate comprising at least one metallization plane forming a connection between the first and second sub-filters.

13. The component of claim 12, wherein the substrate comprises a multilayered ceramic.

14. The component of claim 13, wherein the multilayered ceramic of the substrate includes the at least one metallization plane, and the component further comprises passive circuit components in the at least one metallization plane, the passive circuit components connected to the first filter.

15. The component of claim 12, wherein the substrate comprises a module substrate and the component further comprises additional components on the module substrate, the additional components selected from the group consisting of filters, active semiconductor components, and passive components.

16. The component of claim 1, wherein the compensation layer comprises silicon oxide and has a thickness of 10-40% of an acoustic wavelength of a center frequency of the temperature compensated sub-filter.

17. A component comprising:

a first filter configured to work with acoustic waves, the first filter comprising: a first sub-filter on a first chip; and a second sub-filter on a second chip separate from the first chip, the first sub-filter being a different type of filter, having a different layer structure, or having a different layer thicknesses for at least one layer than the second sub-filter;

a second filter on the first chip with the first sub-filter; and wherein a first one of one of the first and second sub-filters comprises one or more SAW resonators and is temperature compensated by a compensation layer applied to the associated first one of the first or second chips, the compensation layer being configured such that an acoustic surface wave propagates at least partially in the compensation layer and the compensation layer has lower temperature sensitivity of frequency than the material forming the first or second chip; and wherein a second one of the first and second chips is not temperature compensated and does not include a temperature compensation layer.

18. A component comprising:

a first filter configured to work with acoustic waves, the first filter comprising: a first sub-filter on a first chip; and a second sub-filter on a second chip separate from the first chip, the first sub-filter being a different type of filter, having a different layer structure, or having a different layer thicknesses for at least one layer than the second sub-filter;

a third filter on the same chip with the first sub-filter or the second sub-filter;

wherein a first one of one of the first and second sub-filters comprises one or more SAW resonators and is temperature compensated by a compensation layer applied to the associated first one of the first or second chips, the compensation layer being configured such that an acoustic surface wave propagates at least partially in the compensation layer and the compensation layer has lower temperature sensitivity of frequency than the material forming the first or second chip; and wherein a second one of the first and second chips is not temperature compensated and does not include a temperature compensation layer.

* * * * *

UNITED STATES PATENT AND TRADEMARK OFFICE
CERTIFICATE OF CORRECTION

| | |
|---|---|
| PATENT NO. | : 7,859,363 B2 |
| APPLICATION NO. | : 12/067728 |
| DATED | : December 28, 2010 |
| INVENTOR(S) | : Juergen Kiwitt et al. |

It is certified that error appears in the above-identified patent and that said Letters Patent is hereby corrected as shown below:

Claim 1, Column 6, Line 62 – delete "one of one of" and insert -- one of --, therefor.

Claim 17, Column 8, Line 22 – delete "one of one of" and insert -- one of --, therefor.

Claim 18, Column 8, Line 44 – delete "one of one of" and insert -- one of --, therefor.

Signed and Sealed this
Twenty-first Day of June, 2011

David J. Kappos
*Director of the United States Patent and Trademark Office*